United States Patent
Jacob

(10) Patent No.: US 7,592,825 B1
(45) Date of Patent: Sep. 22, 2009

(54) METHODS AND SYSTEMS FOR SEMICONDUCTOR DIODE JUNCTION SCREENING AND LIFETIME ESTIMATION

(75) Inventor: Jonah H. Jacob, Brookline, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 527 days.

(21) Appl. No.: 11/508,054

(22) Filed: Aug. 22, 2006

Related U.S. Application Data

(60) Provisional application No. 60/710,084, filed on Aug. 22, 2005, provisional application No. 60/734,440, filed on Nov. 7, 2005.

(51) Int. Cl.
*G01R 31/00* (2006.01)
(52) U.S. Cl. .................... 324/765; 324/767
(58) Field of Classification Search .......... None
See application file for complete search history.

(56) References Cited

U.S. PATENT DOCUMENTS

| | | | |
|---|---|---|---|
| 3,997,849 A | 12/1976 | Thommen | 330/13 |
| 4,415,815 A | 11/1983 | Dijkmans et al. | 307/243 |
| 5,287,367 A | 2/1994 | Yanagawa | 372/31 |
| 5,604,758 A | 2/1997 | AuYeung et al. | 372/34 |
| 5,812,580 A | 9/1998 | Nabiev et al. | 372/49 |
| 5,818,857 A | 10/1998 | Palmer | 372/32 |
| 5,966,394 A | 10/1999 | Spurr et al. | 372/34 |
| 6,229,833 B1 | 5/2001 | Noda et al. | 372/38.09 |
| 6,249,140 B1 | 6/2001 | Shigihara | 324/767 |
| 6,873,171 B2 * | 3/2005 | Reynick | 324/765 |
| 7,453,261 B1 * | 11/2008 | Mark | 324/158.1 |
| 7,495,874 B2 * | 2/2009 | Mangano | 361/56 |
| 2002/0190666 A1 | 12/2002 | Sakamoto et al. | 315/291 |
| 2003/0039280 A1 | 2/2003 | Mangano et al. | 372/38.02 |
| 2003/0048820 A1 | 3/2003 | Fischer | 372/38.02 |
| 2003/0058906 A1 | 3/2003 | Finn et al. | 372/34 |
| 2003/0091077 A1 | 5/2003 | Fischer | 372/38.02 |
| 2003/0152390 A1 | 8/2003 | Stewart et al. | 398/135 |

OTHER PUBLICATIONS

U.S. Appl. No. 60/710,084, Methods and Systems for High Current Semiconductor Diode Junction Screening, filed Aug. 22, 2005.
U.S. Appl. No. 60/734,440, Methods and Systems for High Current Semiconductor Diode Junction Screening and Lifetime Estimation, filed Nov. 7, 2005.
G. Beister et al. Method for Observation of Facet Degradation and Stabilization in InGaAs-QW/GaAs//AlGaAs Laser Diodes, 23$^{rd}$ Int. Symp. Compound Semiconductors, Inst. Phys. Conf. Ser. No. 155 (1997) 581.

* cited by examiner

*Primary Examiner*—Vinh P Nguyen
(74) *Attorney, Agent, or Firm*—Burns & Levinson LLP; Jerry Cohen; Orlando Lopez

(57) ABSTRACT

Screening methods and systems that can detect semiconductor junction devices that may exhibit sudden failure.

19 Claims, 17 Drawing Sheets

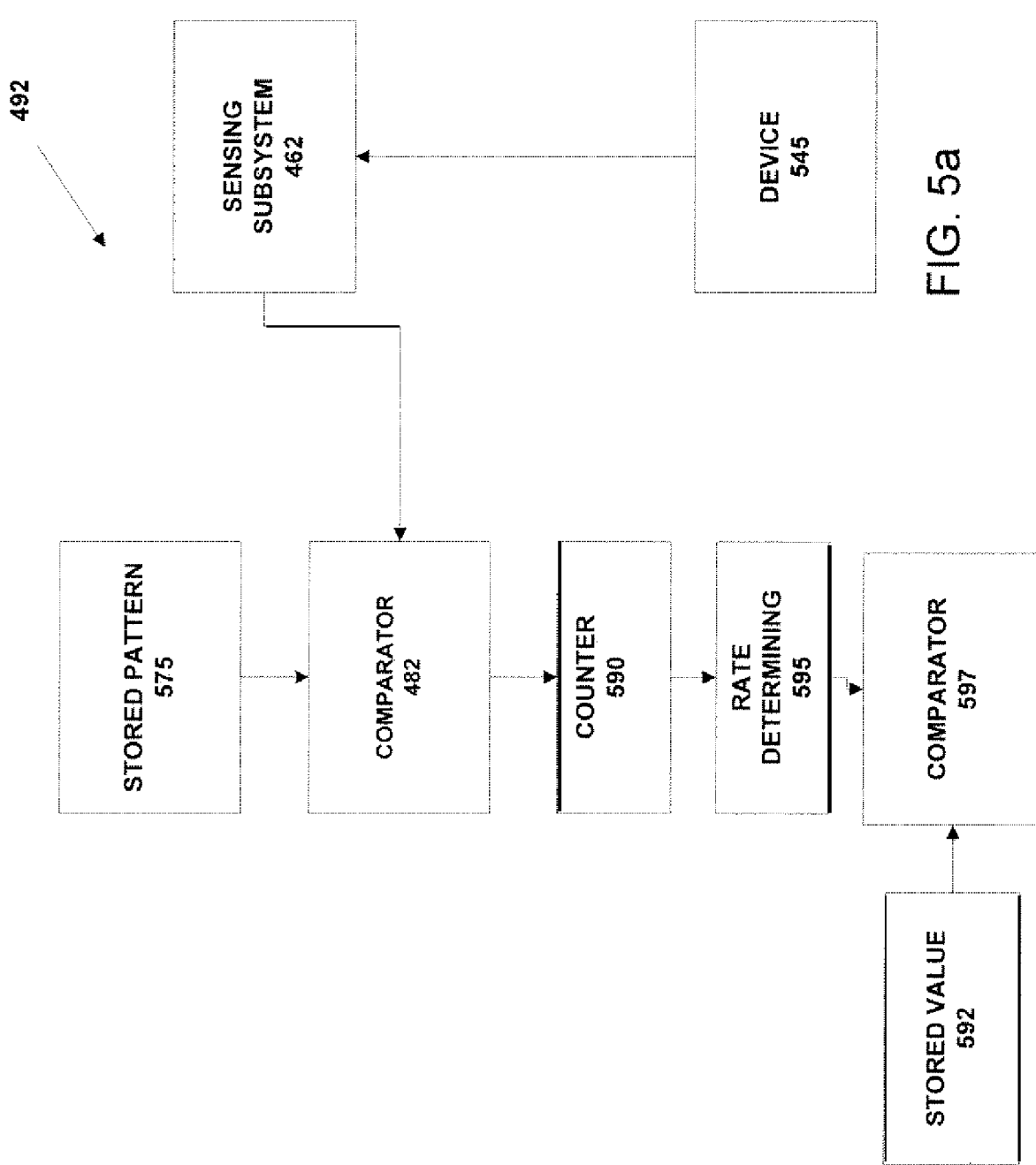

$\Delta T := 0, 1 .. 200$ $\Delta \lambda(t) := 0.25 \cdot \Delta T$

METHODS AND SYSTEMS FOR SEMICONDUCTOR DIODE JUNCTION SCREENING AND LIFETIME ESTIMATION

CROSS REFERENCE TO RELATED APPLICATIONS

This application claims priority of U.S. Provisional Application 60/710,084 entitled "METHODS AND SYSTEMS FOR HIGH CURRENT SEMICONDUCTOR DIODE JUNCTION SCREENING" filed on Aug. 22, 2005, and of U.S. Provisional Application 60/734,440 entitled "METHODS AND SYSTEMS FOR HIGH CURRENT SEMICONDUCTOR DIODE JUNCTION SCREENING AND LIFETIME ESTIMATION," filed on Nov. 7, 2005, both of which are incorporated by reference herein.

FIELD OF THE INVENTION

The present invention relates to semiconductor devices with diode junctions (such as laser diodes), and more particularly to methods and systems for junction device screening.

BACKGROUND OF THE INVENTION

A semiconductor laser (laser diode) transforms electrical energy into optical energy with relatively high efficiency. A laser diode is typically includes a layer of p-type semiconductor material adjacent to a layer of n-type semiconductor material (referred to as a p-n junction). When electrical current passes from the p-type layer to the n-type layer, stimulated emission of optical radiation results in the active layer. In practice, the stimulated emission is limited to only a portion (the active region) of the active layer. The opposing end faces of the active region are called the facets, which are cleaved and/or etched to define a laser cavity between the two facets. A highly reflective dielectric coating is usually deposited on one facet (the non-output facet), and a semi-reflective dielectric coating on the other facet (the output coupling facet). The optical energy generated by the electric current oscillates between the output facet and the non-output facet, and is partially transmitted by the semi-reflective coating at the output facet to produce a diode laser output beam.

Laser diode bars are constructed from a linear array of such individual laser diodes, with all the diodes typically driven in parallel from two highly conducting electrodes. Stacks of these bars can then be driven in series to form a laser diode array, which is a two dimensional array of individual diodes.

Diode junction aging, associated degradation, and catastrophic failure are serious problems in laser diodes. Specifically, one failure mode of laser diodes is catastrophic optical damage (COD), which occurs suddenly after more gradual diode aging in which the performance of the diode degrades slowly with time. Gradual aging is a result of localized junction heating and overheating caused by filamentation of the diode current and of the output optical beam. Initially, current and optical filamentation of the diode current is caused by local variations in the electrical and optical properties along the diode junction. For example, variations in electric field along the junction result in local current variations and also in local optical laser beam intensity variations along the diode output. These variations in electric field and associated current density variations also lead to temperature variations along the junction. Small changes in the local electric field, for example, can lead to changes in the local current density (relative to the average current density in the junction) and temperature, and therefore changes locally in the intensity of the optical laser beam. Gradual aging, resulting from these current density and temperature variations, may culminate in catastrophic optical damage (COD) and/or catastrophic optical mirror damage (COMD). Diodes may also fail due to other factors such as, but not limited to, gradual aging (also related to filamentation or anomalous conditions). COD and COMD are caused by an instability which rapidly leads to catastrophic overheating and results in the failure of that portion of the diode junction. COD and COMD result from destructive overheating of the junction material and/or the diode facet or coating material.

Multiple modes of laser diode failure arise from filamentation of the drive current to the diode or the diode bar, or filamentation of the optical beam within the laser active medium (the active portion of the p-n junction). These modes can range from overheating and destruction of the output facet, migration of dopants, and junction punch through.

In laser diodes, a predetermined current density must be provided in order to reach lasing threshold, and even higher current densities are needed to reach optimum laser output efficiency, laser power, and laser brightness. However, even if the laser is driven by a so-called constant current source, the current can filament in a region or regions of the active junction resulting in some sections of the junction experiencing higher current density than others. With a constant current source, these regions of higher current density have lower impedance to current flow than surrounding regions which experience lower current density than average. It is the sections of the junction experiencing higher current density that have higher temperature, age more rapidly, and are prone to unstable filamentation instabilities. In cases where the current is filamented in the diode, due for example to variations of electric field across the junction, the total current in the diode must be adjusted so that the sections of higher current density do not result in unacceptably rapid aging. However, accommodating these regions of higher current density in this manner reduces the efficiency and intensity in sections of lower current density, and therefore the overall efficiency and power of the diode is ultimately compromised. Since the bandgap of the semiconductor material changes with temperature, filamentation also leads to shifts and spreads of the output spectrum of the laser diode. These shifts and spreads in the output spectrum can reduce the efficiency of coupling to the pump bands of solid state laser media pumped by these laser diodes. Efficiency is defined as optical power output divided by electrical power input.

Controlling the current density in the junctions of laser diodes, laser diode bars (LDBs) and laser diode arrays (LDAs) is complicated by the fact that the junction bandgap decreases with increasing temperature. Injunction regions having higher perturbed electric fields, the current density is higher. In these sections of the laser diode junction with higher current density, the temperature is higher and the bandgap is lower. When the bandgap shrinks, the current density in this section can increase even more at the expense of the current density in adjacent sections (even with a so-called constant current source powering the diode). The increased current density in this section then increases the temperature locally even further, and the bandgap shrinks even further. This instability can continue until the current density and temperature in this section is sufficiently high to cause cumulative incremental damage (aging), and catastrophic damage (COD and/or COMD). These instabilities can be driven by small variations in electric field across the junction, which can be caused by local changes in the junction material properties or by edge effects at the periphery of the junction. These initial variations can also be caused by crystal defects. The positive feedback process starting with increased current density in regions of higher electric field, leads to locally higher temperature, locally reduced bandgap, and then to even higher local current density. This positive feedback results in rapid thermal runaway, and breakdown locally of the p-n junction. This thermal runaway in the region of current filaments creating "hot spots" is referred to as a current filamentation instability In laser diode devices, these current filamentation instabilities can be exacerbated by the nonlinear interaction of the laser beam with the laser gain medium. These Kerr-type instabilities can lead to self-focusing of the laser light within the laser device. This instability can interact with the current instability described above, damaging the diode facets and leading to so-called catastrophic optical damage (COD) and catastrophic optical mirror damage (COMD).

Laser diodes, light emitting diodes, and VCSELs are sometimes arranged in bars or arrays. For bars in which multiple devices are driven in parallel, the same type of fault mode mitigation and protection circuitry used for a single device can be effective in suppressing and protecting against instabilities. In a laser diode bar, all of the laser diodes are driven in parallel from the same current node. Physically this current node is typically fabricated from a material with high electrical conductivity and high thermal conductivity such as copper. These current nodes also serve a second function which is to cool the individual diodes by transporting waste heat generated in the diode to a heat sink.

Current instabilities similar to those which occur in single diodes can also occur in laser diode bars. In addition to filamentation within individual diodes in the bar, this instability also causes current hogging, in which the current to the common node for all the diodes in the bar is not shared equally among the diodes in the bar. The diodes that hog more current than the average current (average current=total current to the node/the number of diodes in the bar) are prone to overheating and thermal runaway. Note that such an instability is not prevented by using current regulating circuitry or so-called constant current sources to power the laser diode bar. Although laser diodes were used here as an example, other devices containing semiconducting junctions such as light emitting diodes and VCSELs are also sometimes arranged in parallel in bars, and the same descriptions and conclusions apply to them as well.

Lifetime testing of laser diodes requires exhaustive tests. Using conventional methods, in order to obtain lifetime versus power information a large number of exhaustive tests have to be performed.

There is a need for screening methods that can detect laser diodes that may exhibit failure.

There is also a need for faster methods of estimating lifetime versus power.

SUMMARY

In an embodiment of the method for test screening a semiconductor device with diode junctions, non-uniformities and transients (filamentation) in current density and local junction temperature create anomalies (transients, such as, but not limited to, a shift to longer wavelengths of the laser diode output, laser diode voltage variations at fixed diode terminal current, laser diode impedance variations) that can be detected. Upon detection of these transients, the number of transients (also referred to as "fault events") in a time period, referred to as the rate of transients or rate, is determined and the rate is compared to a predetermined threshold. If the rate exceeds the predetermined threshold, the device is screened out or culled Another embodiment of the method of these teachings provides a method for obtaining laser diode lifetime as a function of power.

Embodiments of the system of these teachings are also disclosed.

For a better understanding of the present invention, together with other and further objects thereof, reference is made to the accompanying drawings and detailed description and its scope will be pointed out in the appended claims.

BRIEF DESCRIPTION OF THE DRAWINGS

FIG. 5a is a schematic block diagram representation of one embodiment of the system of these teachings for diode screening;

FIG. 6b is a schematic block diagram representation of a detailed embodiment of the system of these teachings of FIG. 6a;

DETAILED DESCRIPTION

Screening methods and systems that can detect semiconductor junction devices that may exhibit various failure modes are disclosed herein below.

While the embodiments presented below are described in terms of laser diodes, it should be noted that the embodiments could be utilized for other semiconductor devices with diode junctions.

While not desiring to be bound by theory, for the current filamentation instability and transients, an estimate of the instability growth rate can be made in terms of diode materials, geometries and other properties.

Initially, electric field variations and resulting current filamentation can lead to large, but stable changes in the local diode junction temperature and in the intensity of the output laser beam (hereinafter referred to as transients). Later, as these stable current, temperature, and optical intensity variations age the diode junction, the filamentation can become unstable, and the larger unstable current, temperature, and intensity changes in the region can lead to diode failure. Diode failure may also result from various other mechanisms, such as, but not limited to, aging, which are related to anomalous behavior (such as filamentation).

Figure 1A:
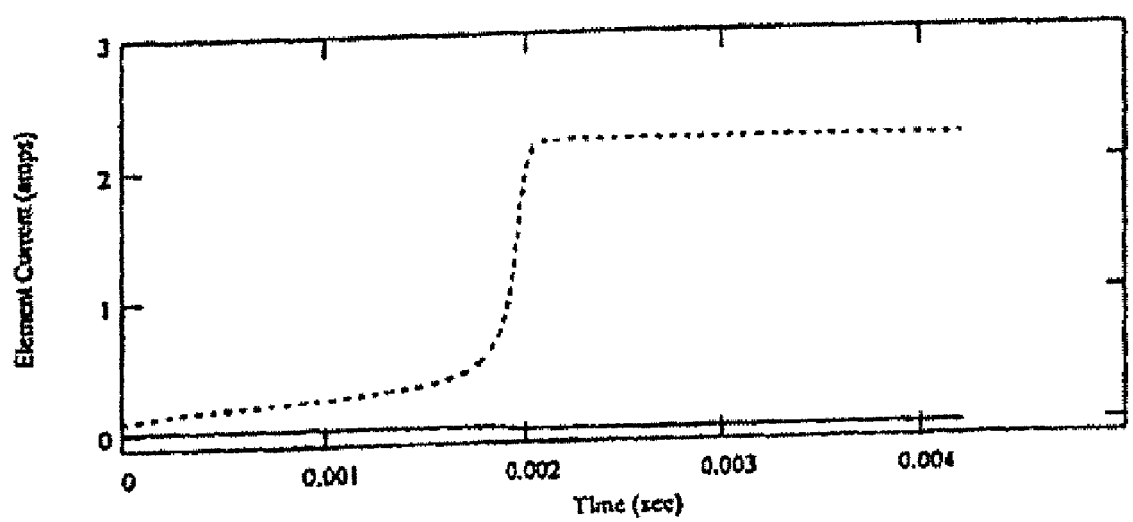
FIG. 1a is a schematic graphical representation of results of a calculation of device current showing the effects of a filamentation instability.
Figure 1B:
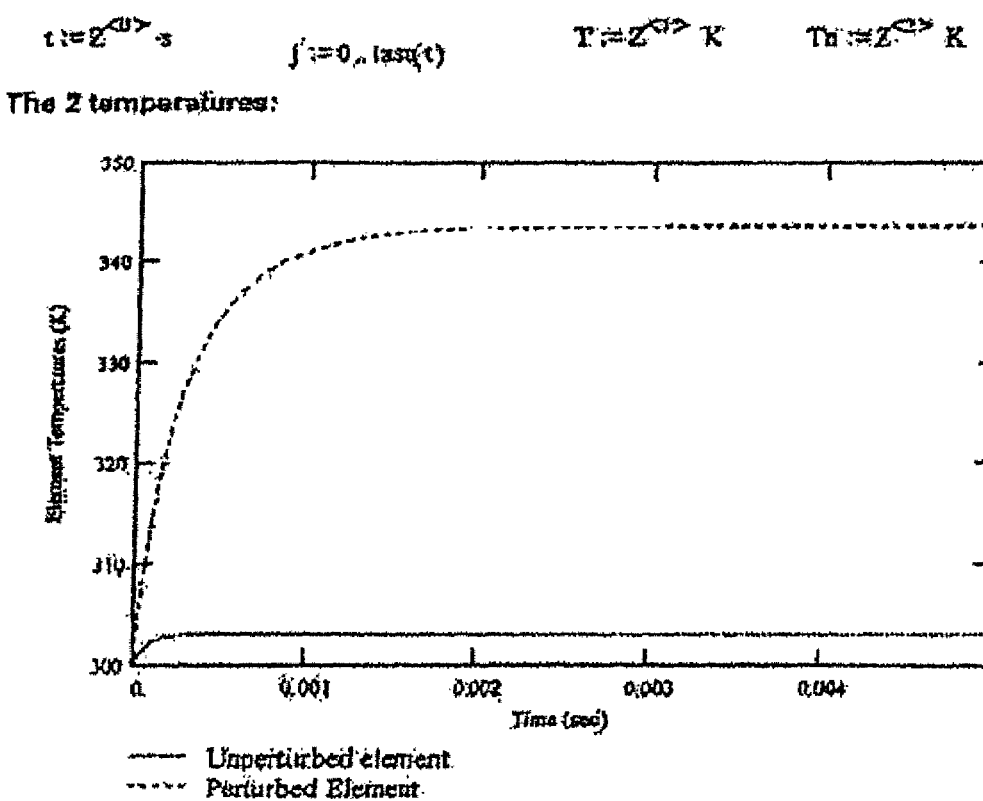
FIG. 1b is a schematic graphical representation of results of a calculation of junction temperature showing the effects of a filamentation instability.
Figure 1C:
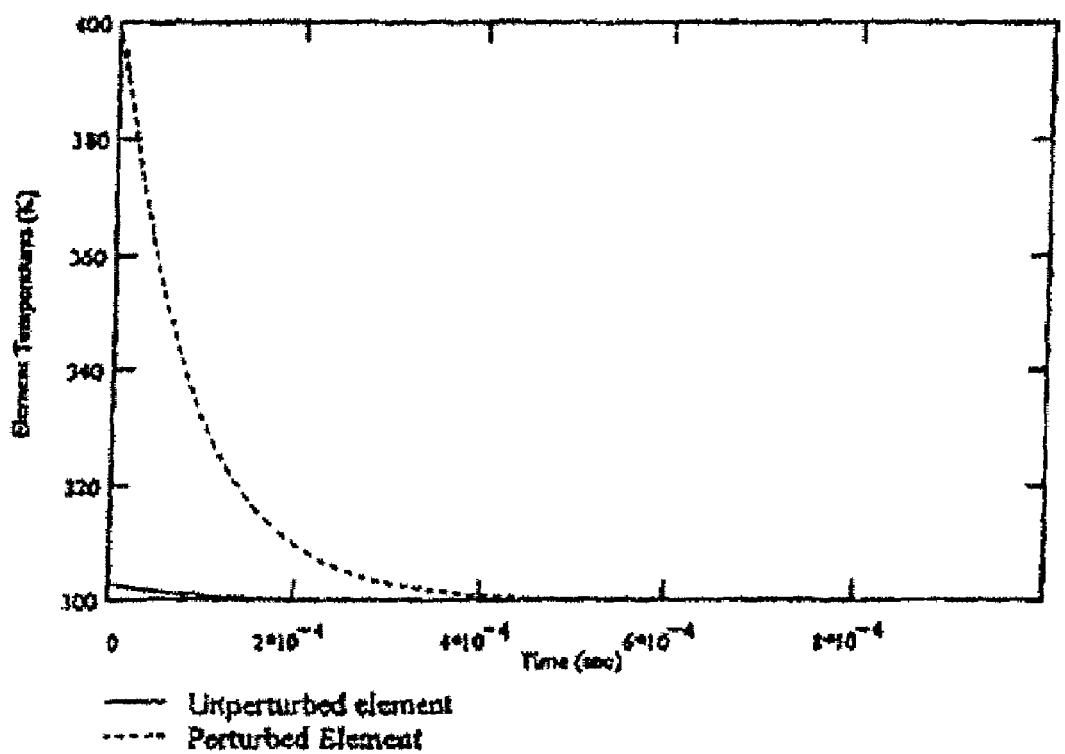
FIG. 1c is a schematic graphical representation of results of another calculation of junction temperature showing the decay of the junction temperature from 400° K after turning off an device.

Equations describing the current filamentation instability, which is driven by variations in the electric field across the junction and depend on the decrease in junction bandgap with increasing junction temperature, are provided in Appendix A of U.S. patent application Ser. No. 10/922,753, which is incorporated by reference in its entirety herein, in order to illustrate an instability that can lead to filamentation in semiconductor devices with diode junctions. FIG. 1a (obtained from FIG. A5 of appendix A in U.S. patent application Ser. No. 10/922,753) indicates that the instability has a finite growth rate in time, and that there is an approximate onset time for the instability to emerge temporally.

Figure 1D:
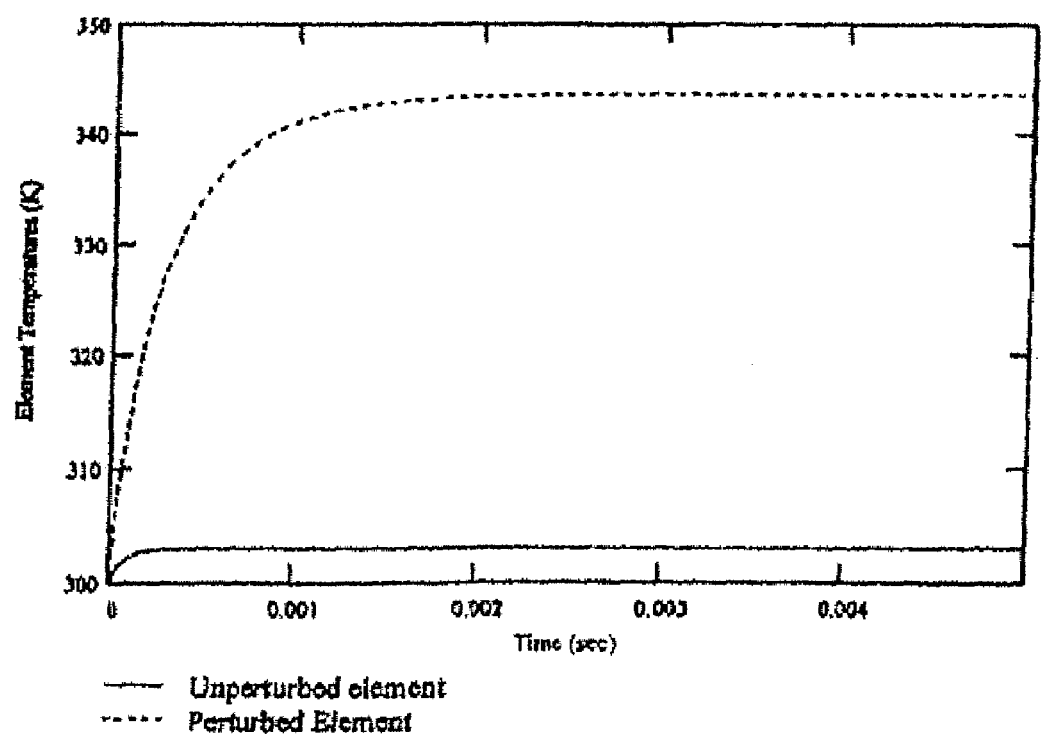
FIG. 1d is a schematic graphical representation of results of another calculation of junction temperature showing the effects (stable filamentation) of an electric field variation of 2% in the perturbed element.

FIG. 1d shows results of calculations, according to the methods of Appendix A of U.S. patent application Ser. No. 10/922,753, which is incorporated by reference herein in its entirety, indicating the stable temperature behavior of a current filament created by a non-uniformity in electric field locally across the junction when the junction is driven by a current source. The temperature of the remainder of the junction is also shown. Note that the perturbed element has a temperature of 343° K while the temperature of the remaining elements in the junction are approximately 303° K.

Figure 2:
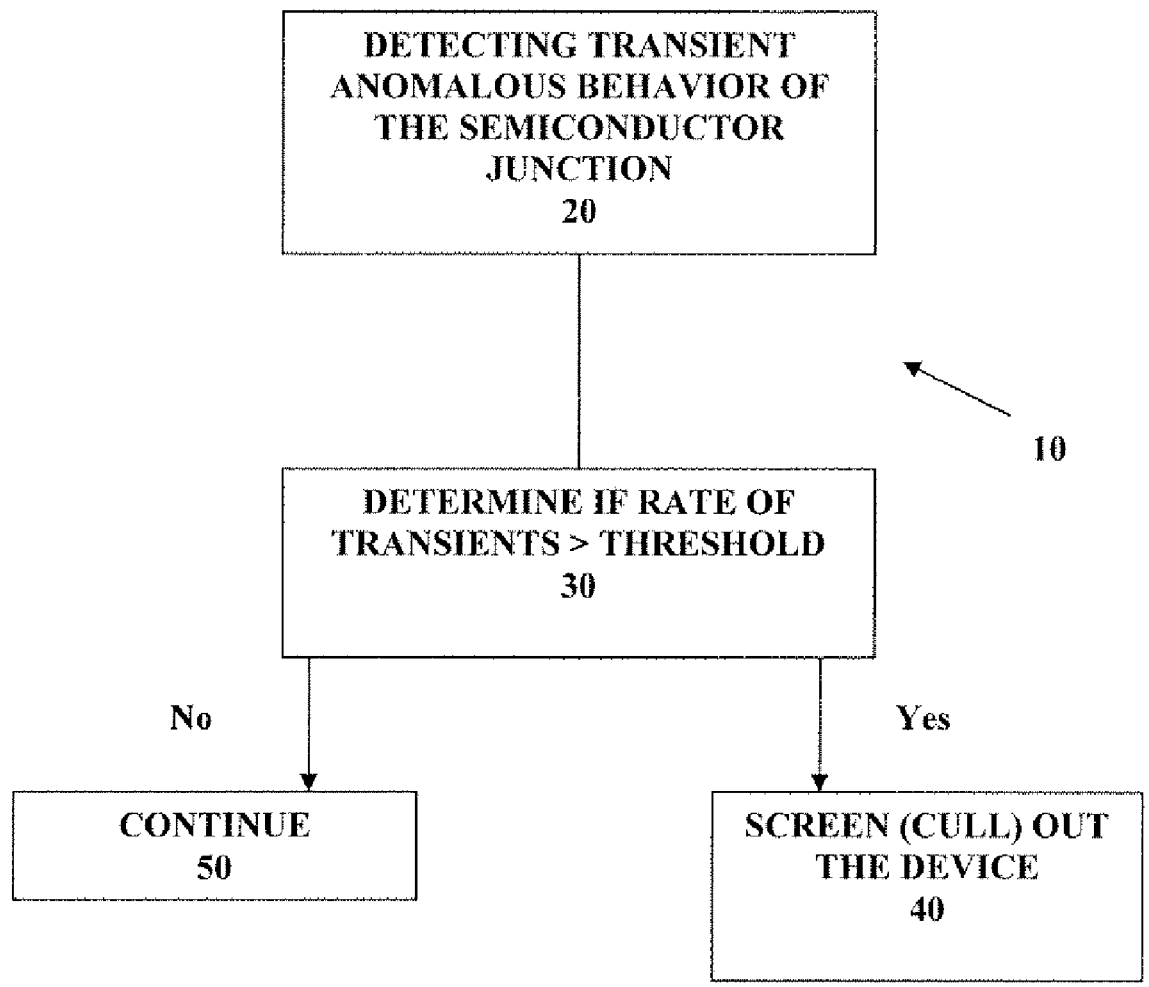
FIG. 2 is a flowchart representation of an embodiment of the method of these teachings for diode screening.

FIG. 2 depicts a flowchart representation 10 of one embodiment of the method for diode screening. Referring to FIG. 2, non-uniformities and transients (filamentation) in current density and local junction temperature create anomalies (transients, such as, but not limited to, a shift to longer or shorter wavelengths of the laser diode output, laser diode voltage variations at fixed diode terminal current, laser diode impedance variations) that can be detected (step 20, FIG. 2). Upon detection of these transients (anomalies), the number of transients (also referred to as "fault events") in a time period, referred to as the rate of transients or rate, is determined and the rate is compared to a predetermined threshold (step 30, FIG. 2). If the rate exceeds the predetermined threshold, the device is screened out or culled (step 40, FIG. 2). If the rate does not exceed the predetermined threshold, testing continues or the diode may be selected as acceptable according to predetermined criterion (step 50, FIG. 2).

Figure 3:
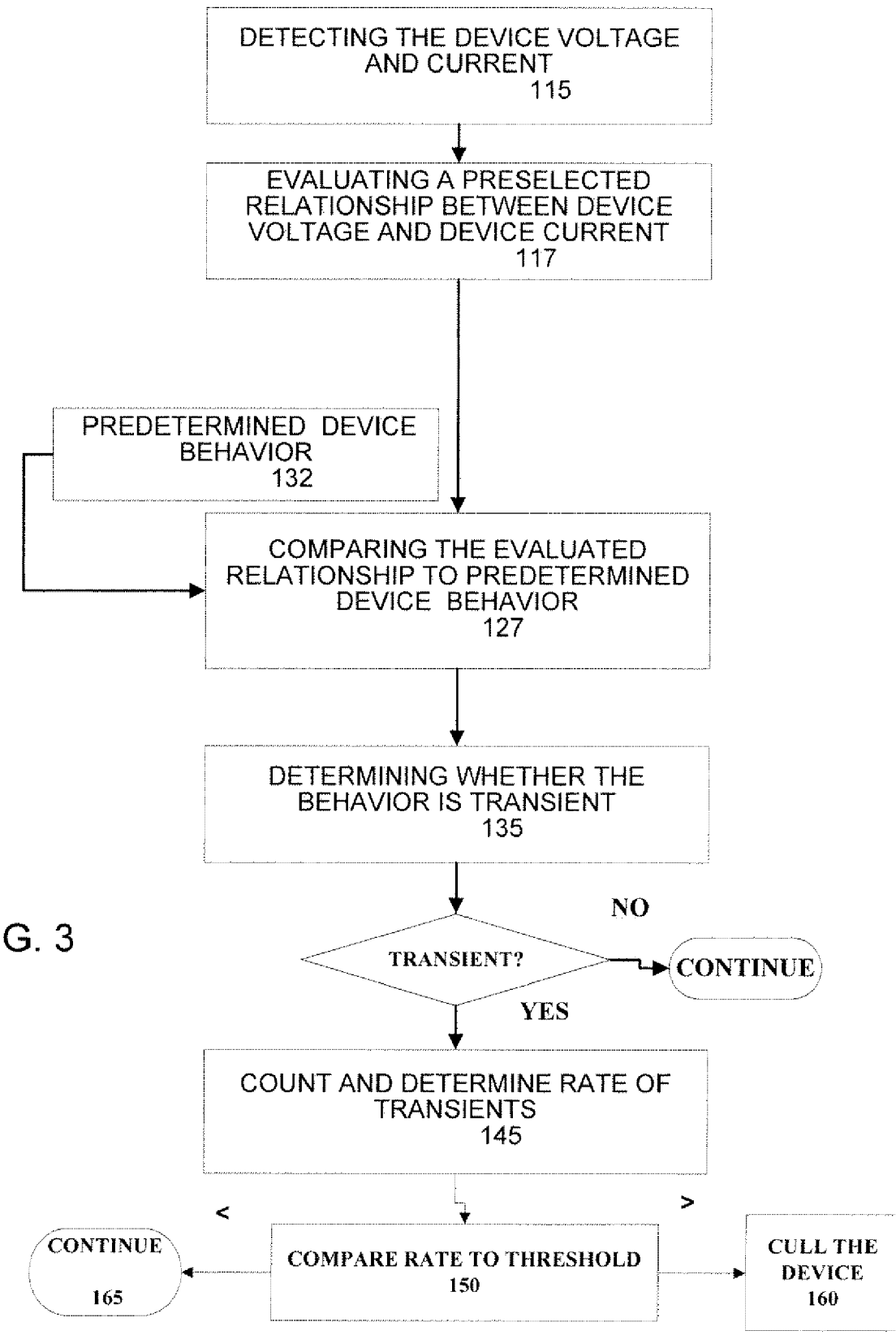
FIG. 3 is a flowchart representation of a detailed embodiment of the method of these teachings for diode screening.

FIG. 3 shows a flowchart representation 100 of a detailed embodiment of the method for diode screening. Referring to FIG. 3, the device voltage, V(t), and the device current, I(t) are measured (step 115, FIG. 3). FIG. 1a (representative of the results shown in FIGS. A2, A3, and A4 of Appendix A of U.S. patent application Ser. No. 10/922,753) indicates that a change in the device impedance, $V(t)/I(t)$, accompanies the onset of the instability. This change in the device impedance, $V(t)/I(t)$, from the stable case to the unstable case can be utilized to sense the onset of anomalous conditions (such as the filamentation instability). In one embodiment of the invention, the relationship between the device terminal voltage and current (Step 117, FIG. 3) and its relationship to the active junction temperature can be calibrated for each type of diode so that the diode junction temperature can be determined from measuring a relationship between the device terminal voltage and the device current such as, but not limited to, the diode terminal impedance. Anomalous conditions (such as filamentation) are detected by comparing (step 127, FIG. 3) a relationship between the device terminal voltage and the device current, $V(t)/I(t)$ in one embodiment, to a predetermined value of the relationship between the device terminal voltage and the device terminal current indicating the onset of filamentation transients (step 135, FIG. 3). It should noted that predetermined values of the relationship between the device terminal voltage and the device terminal current for the onset of transients could be generated previously from a number of previous observations. The change in the relationship between the device terminal (or junction) voltage and the device terminal current, in one embodiment the device impedance, $V(t)/I(t)$, indicates the transition from stable to transient operation (from unfilamented to filamented operation), and therefore is used in this embodiment in order to determining that a transient has occurred. Upon detection of anomalous conditions (such as, filamentation transients) in the above described manner, the transients are counted and a rate of transients is determined (step 145, FIG. 3). The rate is then compared to the predetermined threshold (step 155, FIG. 3) If the rate is greater than the threshold, the device is screened (culled) (step 160, FIG. 3). If the rate is less than the threshold, testing continues or the diode may be selected as acceptable according to predetermined criterion (step 165, FIG. 3).

It should be noted that embodiments of the method of these teachings in which the device voltage is detected at a fixed current will be performed similar to the embodiment shown in FIG. 3a, except that the predetermined relationship is the voltage in the embodiment.

One example of the analytic relationship that might exist between the change in diode terminal voltage at a preselected current and the resulting change in junction temperature is provided by the calculation in Appendix A of U.S. patent application Ser. No. 10/922,753 (Equations 5-8 therein).

The junction temperature rise typically leads to a shift in diode emission to longer or shorter wavelengths. While not desiring to be bound by theory, this wavelength shift can be a direct result of the decrease in photonic junction bandgap with increasing temperature. Such wavelength shifts in the diode output beam can also be used to sense the onset of filamentation, since filamentation instabilities and transients produce regions of shifted temperature and thus a change in the wavelength of the radiation.

Figure 4:
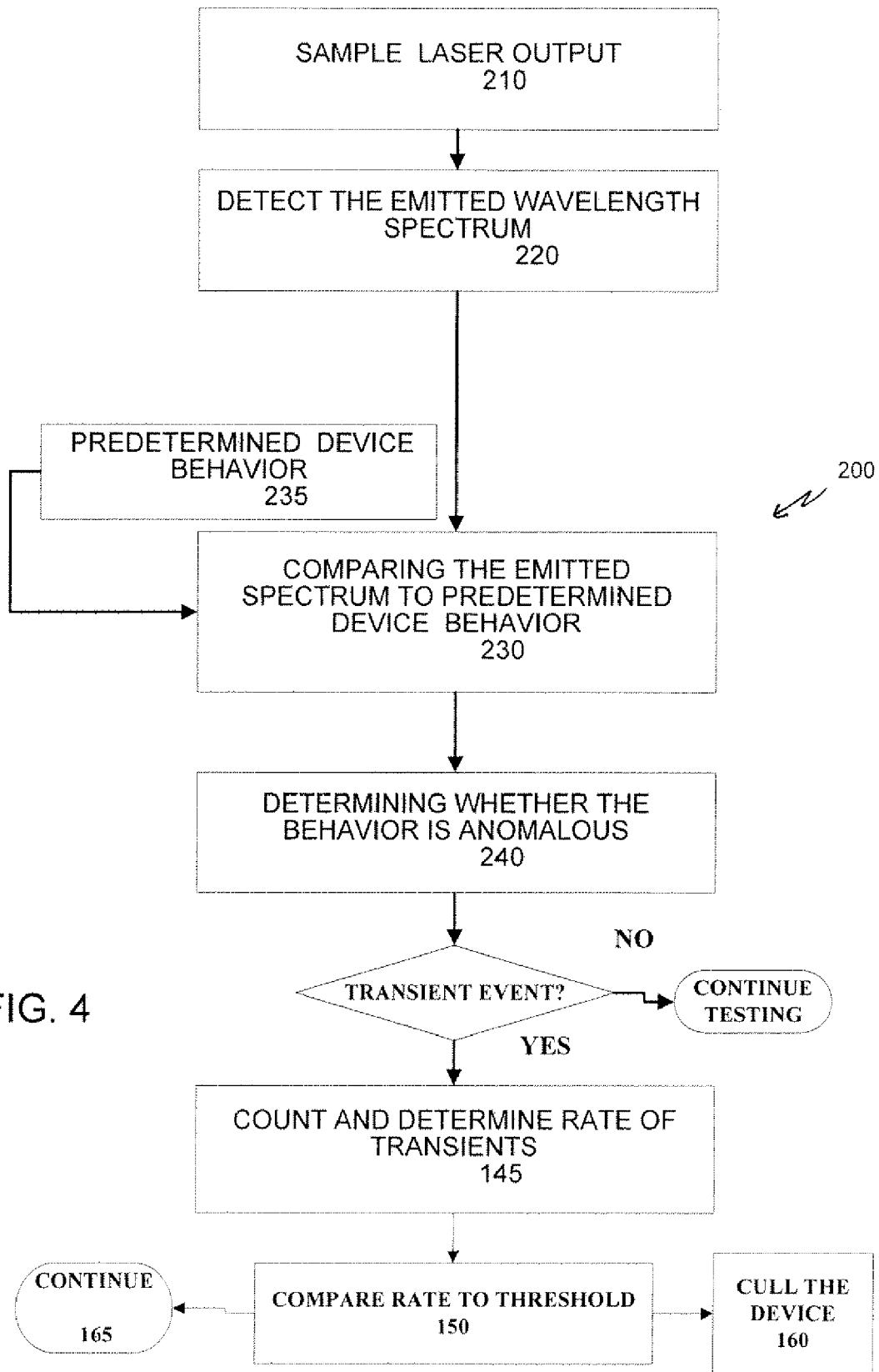
FIG. 4 is a flowchart representation of yet another detailed embodiment of the method of these teachings for diode screening.

FIG. 4 shows a flowchart representation 200 of another detailed embodiment of the method for diode screening. Referring to FIG. 4, a small sample of the total laser diode output is obtained (step 210, FIG. 4) and the wavelengths of the laser diode output detected (step 220, FIG. 4). The wavelength is compared to behavior during substantially unfilamented operation (step 230, FIG. 4). From the comparison, filamentation and the degree of filamentation in the junction can be detected (step 240, FIG. 4). Upon detection of a predetermined level of stable filamentation or unstable filamentation indicative of transient behavior, steps 145 through 165 of FIG. 3 are performed.

FIG. 5a shows a schematic block diagram representation of an embodiment of a system 492 for diode screening. Referring to FIG. 5a, a sensing component 462 provides a sensing output indicative of whether behavior of a semiconductor junction device is substantially anomalous. A comparator subsystem 482 compares the sensing output to a predetermined value 575. If the comparison indicates that the a transient has occurred, a counter 590 counts the number of transients, a rate determining component 595 determines the rate of transients and provides the rate to another comparator 597 (is should be noted that the same comparator 482 used before could also be used, in some embodiments), and the rate is compared to a predetermined threshold 592. The output of the comparator 597 is used to provide a signal to a testing system in order to screen or cull the device. If the comparison indicates that the a transient has occurred, a counter 590 counts the number of transients, a rate determining component 595 determines the rate of transients and provides the rate to another comparator 597 (is should be noted that the same comparator 482 used before could also be used in some embodiments), and the rate is compared to a predetermined threshold 592. The output of the comparator 595 is used to provide a signal to a testing system in order to screen or cull the device.

Figure 5B:
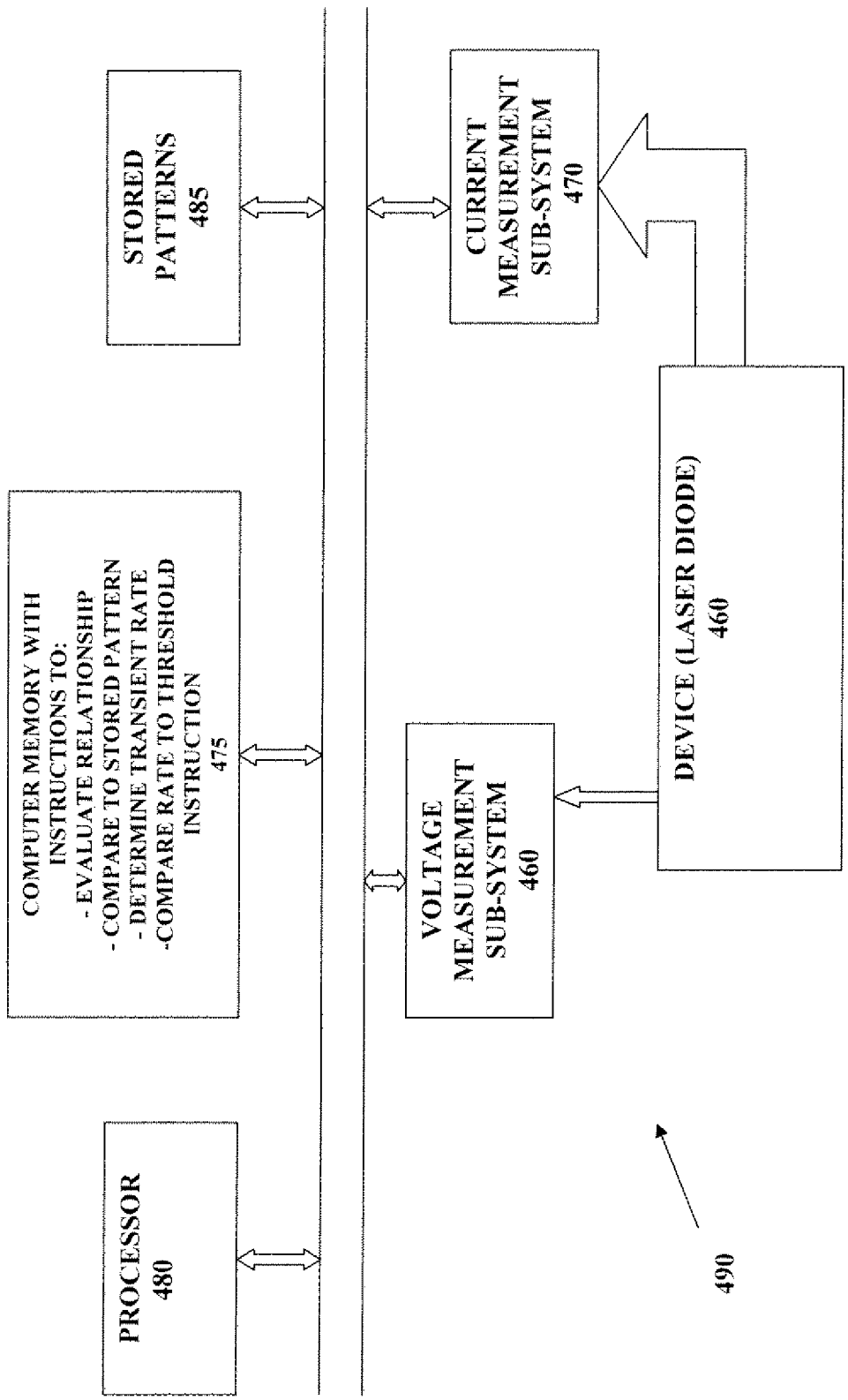
FIG. 5b is a schematic block diagram representation of another embodiment of the system of these teachings for diode screening.

FIG. 5b shows a schematic block diagram representation of another embodiment of a system 490 for diode screening. Referring to FIG. 5b, a voltage measurement system 460 provides the laser diode voltage at discrete time intervals to an operable connection 465, such as a computer bus. A current measurement system 470 provides the laser diode current at discrete time intervals to the operable connection 465. A computer readable memory 475 has a computer readable code embodied therein to instruct a processor 480 to evaluate a relationship between the laser diode voltage and the laser diode current and compare the relationship to the data from a stored pattern (or behavior) 485 indicating transients, count the number of transients and determine a transient rate, compared the transient rate to a threshold, and generate instructions to a testing system based on the comparison of the transient rate to the threshold.

Figure 5C:
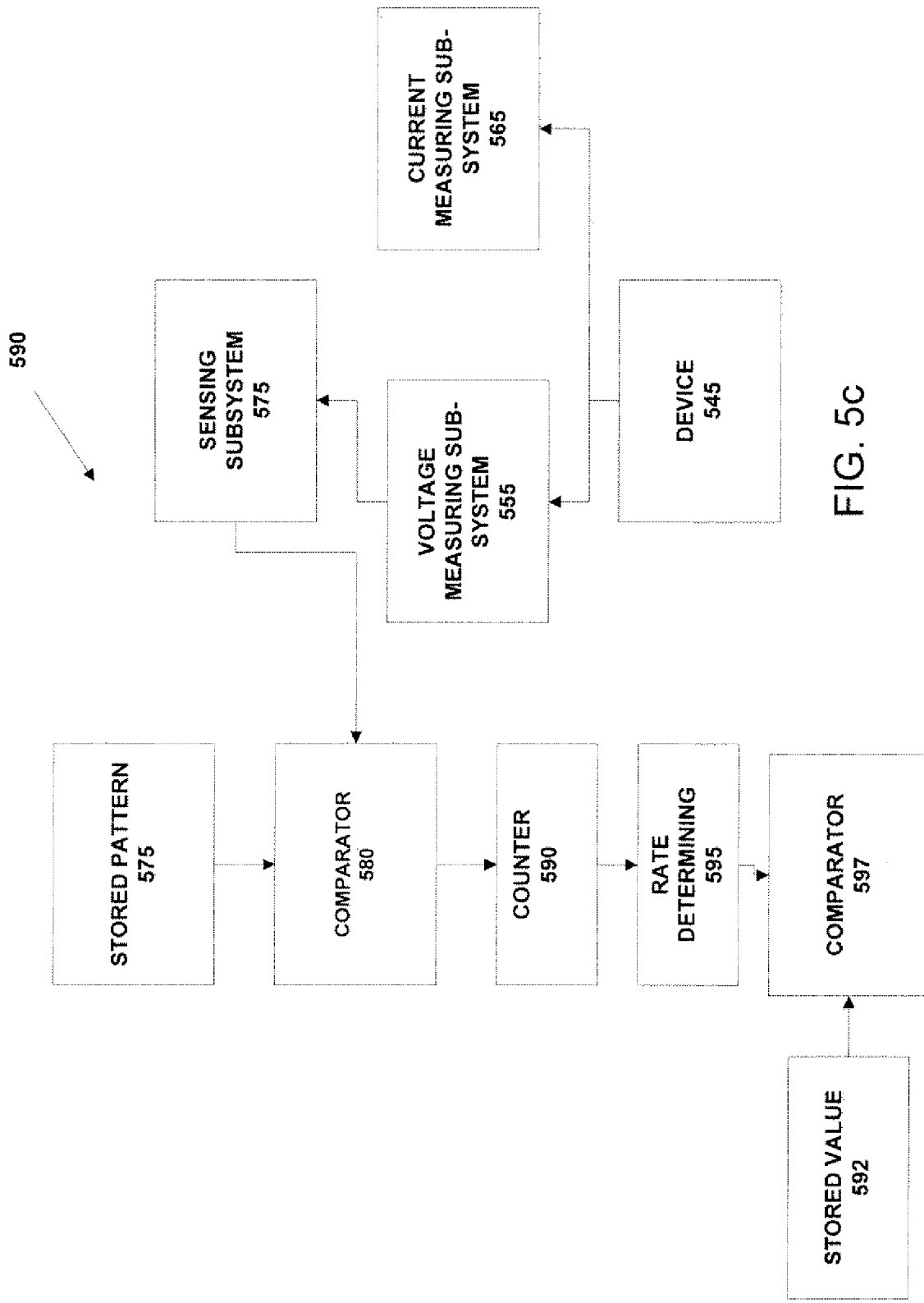
FIG. 5c is a schematic block diagram representation of another embodiment of the system of these teachings for diode screening.

FIG. 5c shows a schematic block diagram representation of a further embodiment of a system 590 for diode screening. Referring to FIG. 5c, a voltage measurement system 555 provides the laser diode voltage, V(t) as a function of time. In one embodiment, the laser diode voltage, V(t), is an analog signal. A current measurement system 565 provides the laser diode current, I(t), as a function of time. In one embodiment, the laser diode current, I(t), is an analog signal. An evaluating sub-system 570 receives the laser diode voltage, V(t), and the laser diode current, I(t), and evaluates a relationship between the laser diode voltage and the laser diode current, such as the impedance. The relationship, in one embodiment, is an analog signal. A reference signal 575 from a database of values of the relationship between the laser diode voltage and the laser diode current indicating transient behavior is compared, by means of a comparator 580, to the values of the relationship generated by the evaluating sub-system 570. The comparator 580 can be an analog system or a hybrid analog/digital system. If the comparison indicates that the a transient has occurred, a counter 590 counts the number of transients, a rate determining component 595 determines the rate of transients and provides the rate to another comparator 597 (is should be noted that the same comparator 580 used before could also be used in some embodiments), and the rate is compared to a predetermined threshold 592. The output of the comparator 595 is used to provide a signal to a testing system in order to screen or cull the device.

The diode terminal voltage decreases from its equilibrium value as the transition is made from stable operation to unstable operation in a diode laser driven by a substantially constant current. Typically, this decrease is significant and can easily be detected from the diode or diode bar terminals. This decrease in device terminal (or junction) voltage accompanies the transition from stable to transient operation (from unfilamented to filamented operation), and therefore is used in the above described embodiment as a signal to screen or cull the device.

Figure 6A:
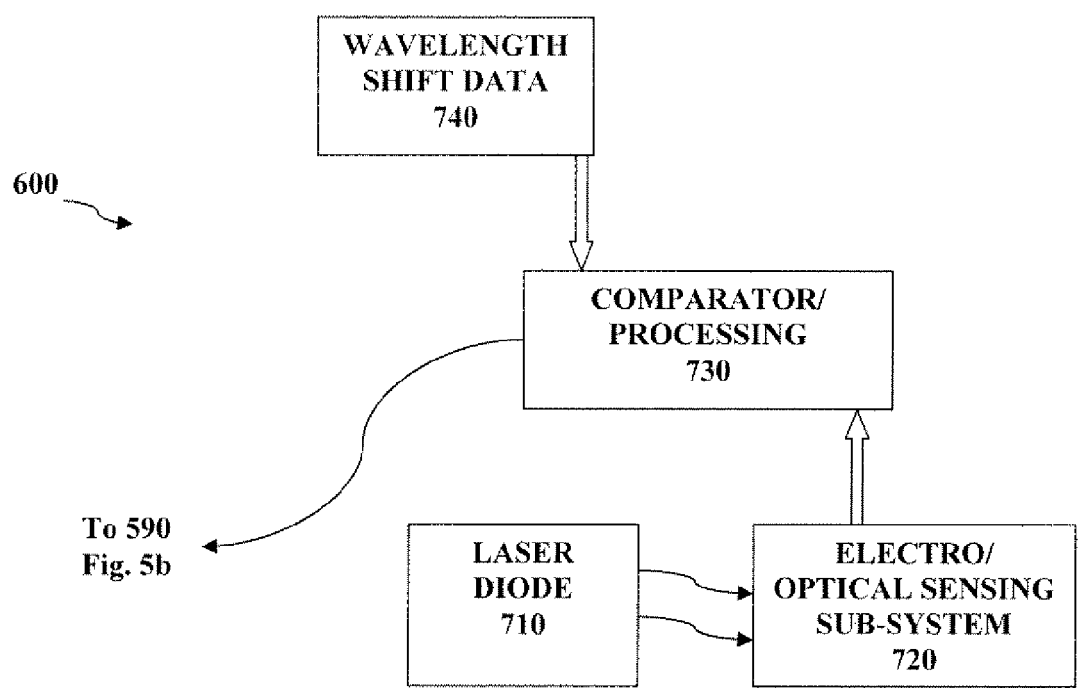
FIG. 6a is a schematic block diagram representation of yet another embodiment of the system of these teachings for diode screening.
Figure 7:
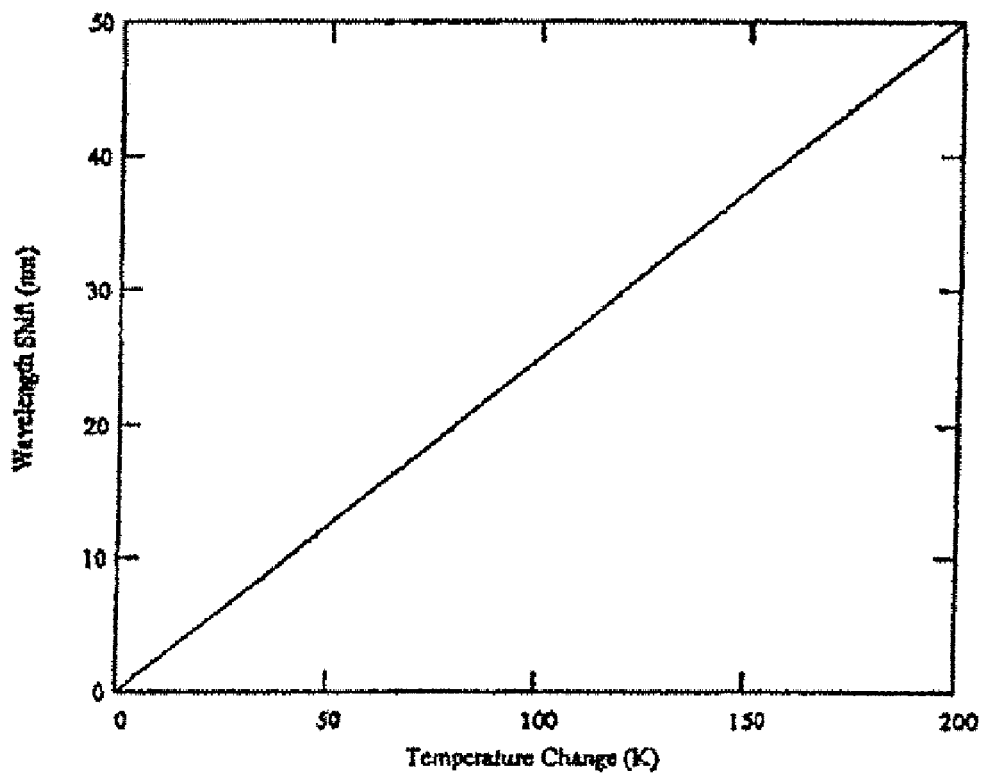
FIG. 7 is a schematic graphical representation of results of a calculation of wavelength shift associated with junction temperature.

FIG. 6a shows a schematic block diagram representation of yet another embodiment of a system 600 for diode screening. Referring to FIG. 6a, an optical sensing device 720, such as, but not limited to, an optical system sampling a fraction of the total output of the laser diode (or junction device) or sensing the total back facet emission, senses the wavelengths of the laser diode output. One embodiment, but not limited to, of the optical system sampling a fraction of the output of the laser diode is an optical filter constructed with multi-layer dielectric coatings. The filter would be designed to pass wavelengths longer (or shorter) than the wavelengths associated with normal stable operation of the laser diode. For example, in a diode designed to radiate at 808 nm at normal operating temperature, most of the radiation is contained in a band of approximately a 2 nm width about 808 nm. The wavelength shift associated with a junction temperature rise locally of $\Delta T$ is shown in FIG. 7. If it was desired in one embodiment to detect a temperature rise of 50° K, then the filter would be designed to pass wavelengths above 820.5 nm, and to reject or absorb wavelengths below 820.5 nm. A small fraction of the light from the diode would be sampled (note that it is important to sample light from all parts of the output aperture of the diode, diode bar, or diode array), and sent to the filter. In one embodiment, any light with wavelength greater than a preselected value (820.5 nm in the example discussed above) then passes through the filter and is detected on a standard photodetector sensitive at wavelengths of the preselected value (820.5 nm in the example discussed above) and above.

Wavelength shift data (previously obtained) 740 indicating the occurring of transients (anomalous device behavior and parameters) is compared to the output of the optical sensing device 720 by a comparison/processing system 730. In one embodiment the wavelength shift data (previously obtained) 740 provides a predetermined threshold. When the signal from the optical system sampling a fraction of the output reaches a certain threshold, the detector signal indicates that, in the laser diode operation, a transient has occurred. If the comparison indicates that a transient has occurred, the comparator signal is provided to the components 590-597 in FIG. 5c.

Figure 6B:
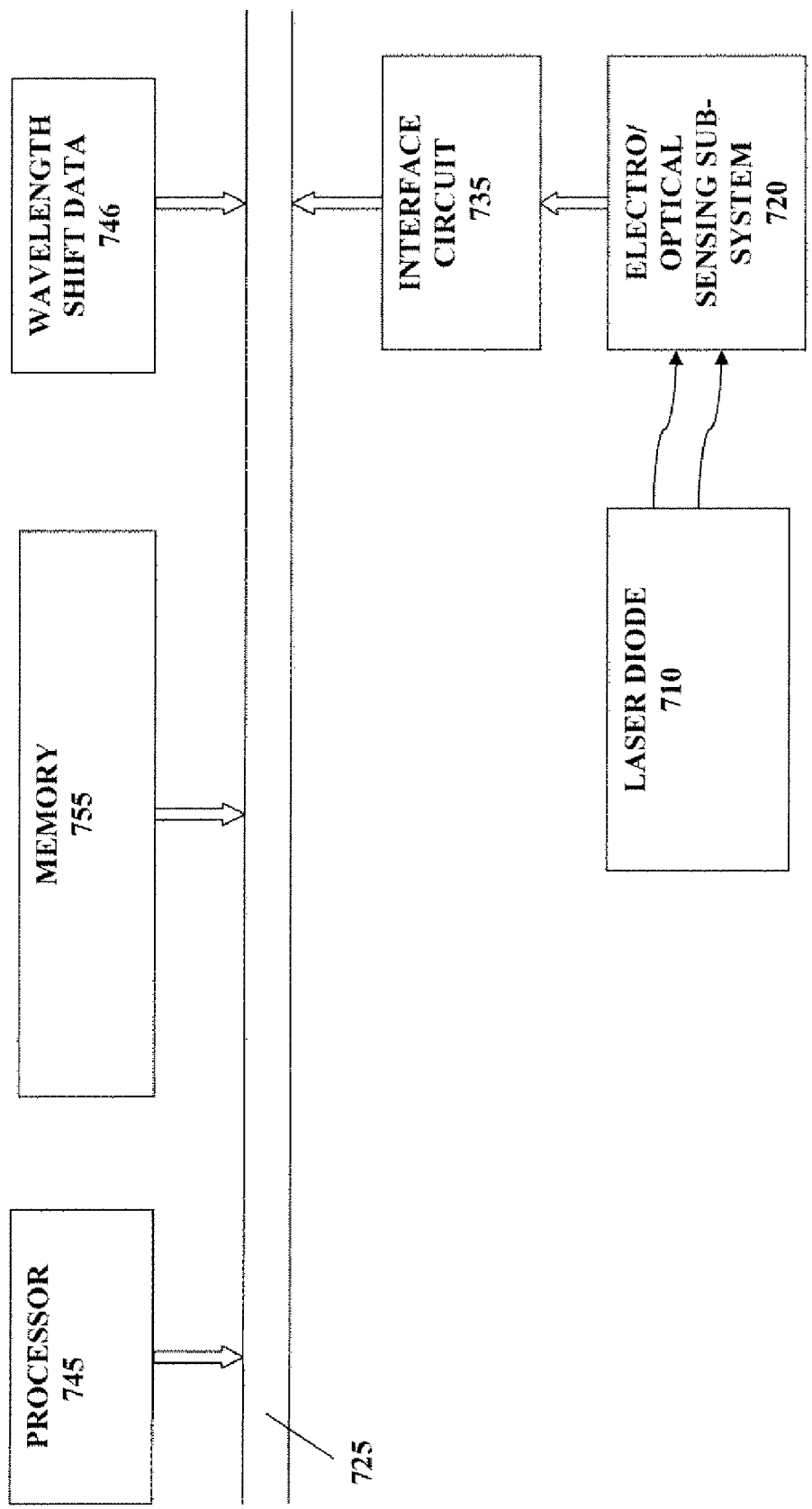

One embodiment of the comparison/processing system 730 is shown in FIG. 6b. Referring to FIG. 6b, the optical sensing device 720 provides laser diode wavelength data via an interface circuit 735 to an operable connection 725, such as a computer bus. A computer readable memory 755, also connected to the operable connection 725, has a computer readable code embodied therein to instruct a processor 745 to detect the occurrence of transients, and provide a signal to the components 590-597 of FIG. 5b or perform the equivalent processes utilizing the processor 745.

In the embodiments of the system for diode screening shown in FIGS. 5a-5c and 6a, 6b, the means for providing data indicating the occurrence of transients (anomalous behavior) are different depending on whether the comparator in the system operates as a mostly digital or mostly analog. For a mostly digital comparator, a pattern or value(s) indicative of anomalous behavior is stored in a computer readable memory. A pattern could be stored as a set of instructions that cause a processor to calculate the pattern. The pattern or data is provided or retrieved by the processor. For a mostly analog comparator, a value is stored as a reference quantity (voltage, for example) and pattern is obtained from an analog circuit (or a digital implementation and a D/A circuit). The reference value or pattern signal is provided as an input to the mostly analog comparator.

Similarly, in the embodiment of the system for diode screening shown in FIGS. 5*a* and 5*b*, the means for providing values indicative of a preselected relationship between the device voltage and the device current are different depending on whether the comparator in the system operates as a mostly digital or mostly analog device. For a mostly digital comparator, a computer readable code stored in a computer readable memory provides instructions to a processor that allow the calculation of the relationship between the device voltage and the device current. For a mostly analog comparator, the signals indicative of the device voltage and the device current are provided to a circuit (a dedicated circuit or an equivalent to an analog computer circuit) that generates a signal indicative of the preselected relationship between the device voltage and the device current.

A signal indicative of the voltage and a signal indicative of the current may be used to produce a signal indicative of a relationship between the voltage and the current, such as the impedance of a laser diode.

Figure 8:
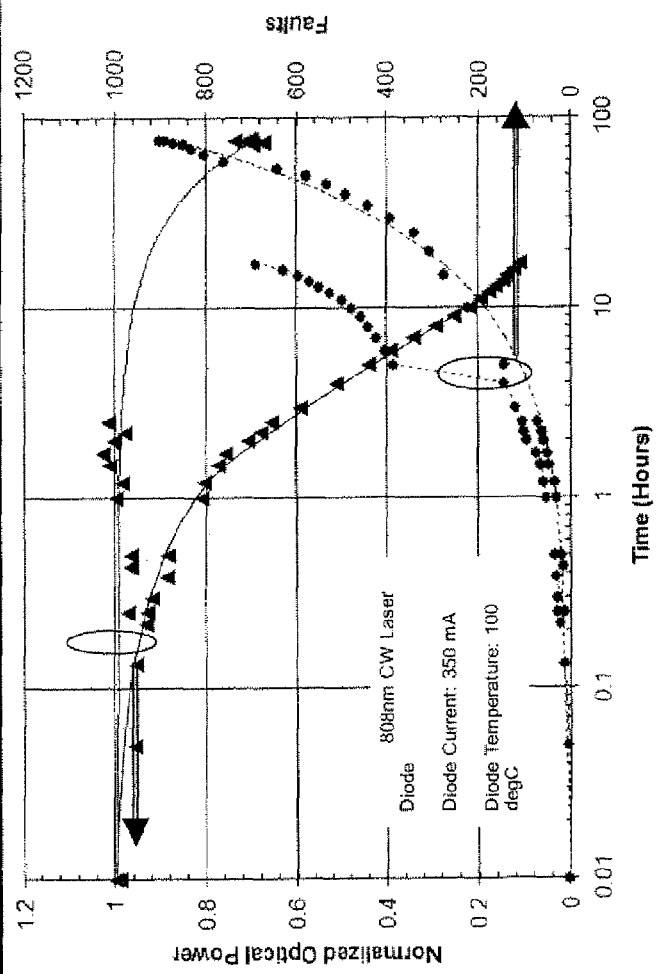
FIG. 8 is a schematic graphical representation of results of testing a laser diode.
Figure 9:
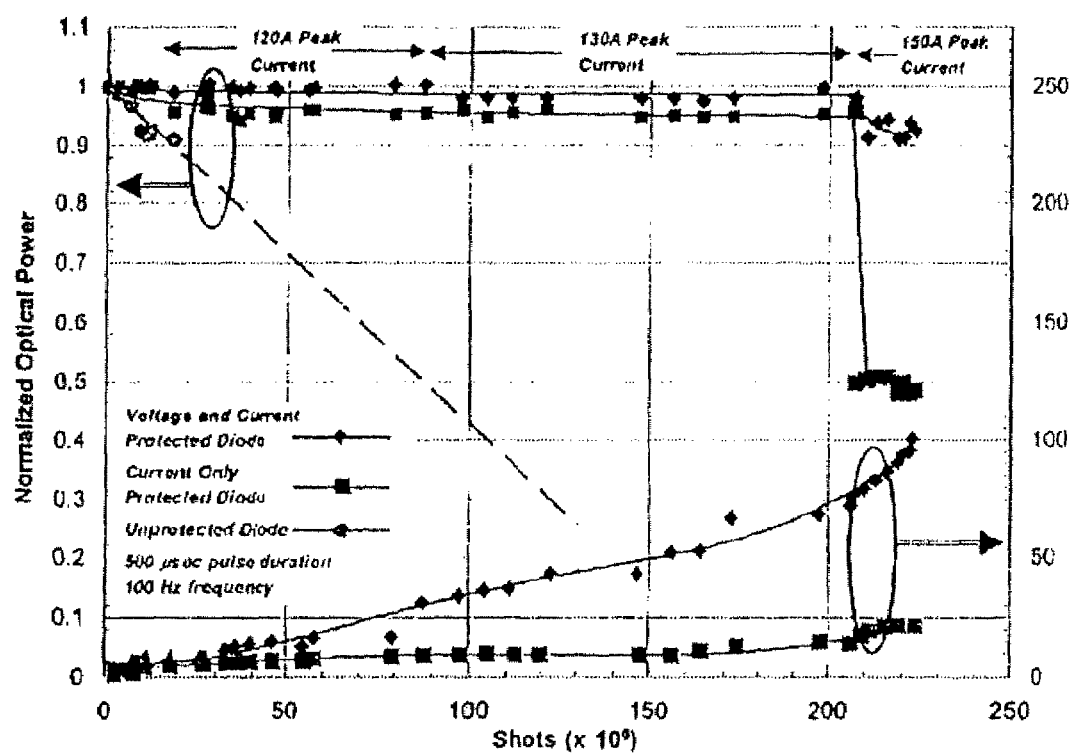
FIG. 9 is a schematic graphical representation of results of testing a laser diode array.

FIGS. 8 and 9 provide illustrative results of the method and systems of these teachings. As shown in FIGS. 8 and 9, an unprotected laser diode or laser diode array exhibits and increase in the number of faults (transients) and the number of faults in a time period, the transient rate. Detecting such an increase, as in the methods and systems of these teachings, allows the screening of the device.

It should be noted that although the embodiments presented above utilize the rate of transients, if the time period utilized is constant, the number of transients can be used in the same manner that the rate is used in the methods and systems of these teachings.

Figure 10:
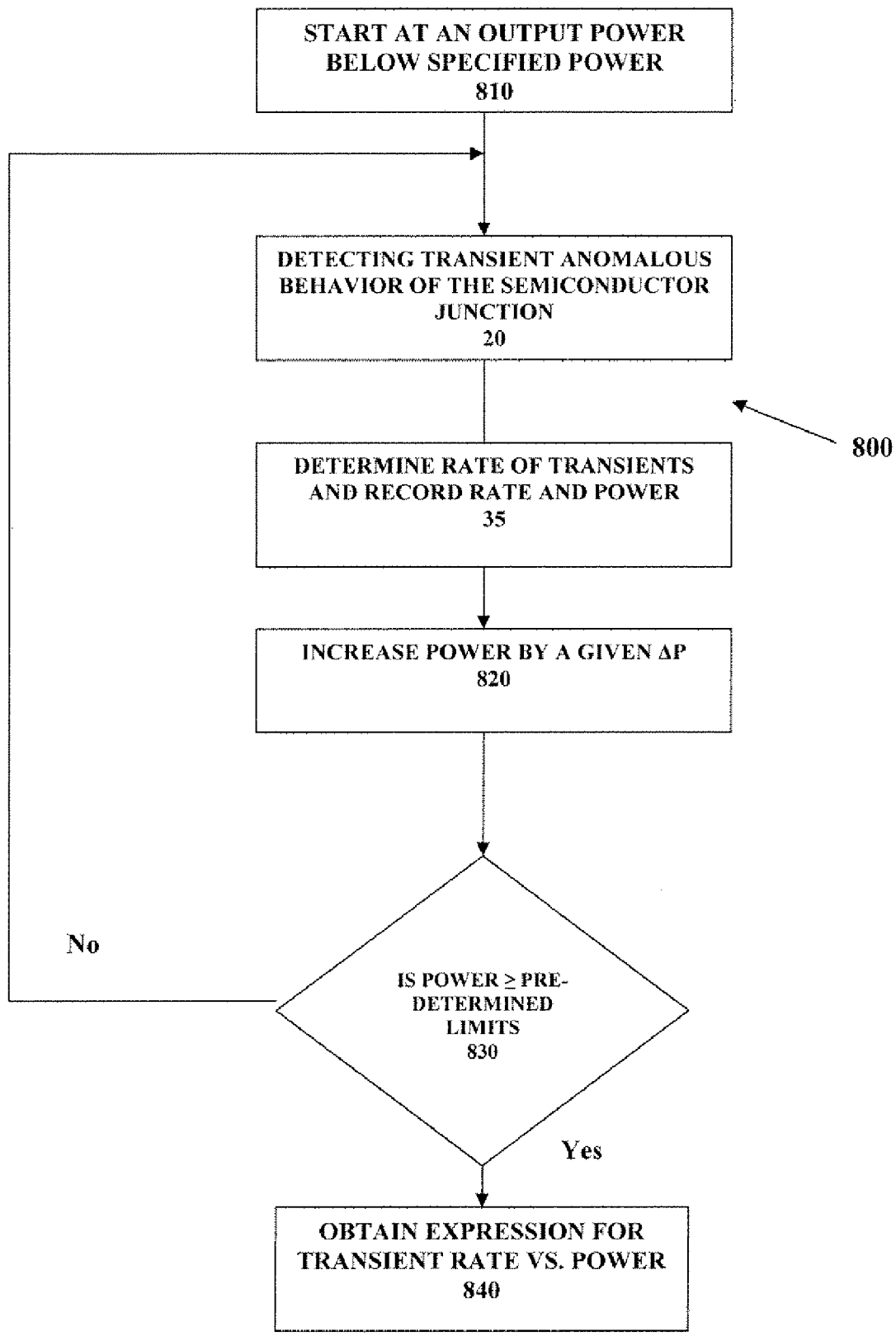
FIG. 10 is a flowchart representation of an embodiment of the method of these teachings for obtaining estimates of lifetime.

An embodiment of the method of these teachings for estimating lifetime as a function of output power (or equivalently, pump power) is shown in FIG. 10. FIG. 10 includes some of the steps of the method shown in FIG. 2. The labeling used in FIG. 2 is retained in FIG. 10. Referring to FIG. 10, the method starts at an output power below a specified power (such as, in one instance, the rated power; step 810). Transients are detected in the behavior of the semiconductor junction or laser diode (step 20). The rate of transients is determined and the rate of transients and power (output power or equivalently pump power, hereinafter referred to as power) are recorded (step 35). Subsequently, the power is increased by a given amount, ΔP (step 820). If the power does not exceed a predetermined limit or the diode has not failed (step 830), steps 20 through 820 are repeated. If the power is greater than or equal to the predetermined limit of failure has occurred, an expression of for the transient rate versus power is obtained (step 840). In one instance, the criterion at step 830 requires failure to occur. In that instance, the total number of transients and pulses (in pulsed operation) or time (in CW operation) is also recorded.

In the instance in which the relationship between the transient rate and the lifetime of the laser diode (or semiconductor junction) is linear, the lifetime at a power less than the rated power (referred to as a derated power) can be obtained by multiplying the lifetime at rated power by ratio of the transient rate at the predetermined limit (in one instance, 20% higher than the rated power) to the transient rate at the derated power.

In the instance in which the relationship between the transient rate and the lifetime of the laser diode (or semiconductor junction) is not linear, an indication of the relationship between the transient rate and the lifetime of the laser diode (or semiconductor junction) can be obtained by performing lifetime and transient rate measurements at a limited number of values of power. Utilizing the curve or functional relationship between transient date and lifetime obtained from the limited number of measurements (obtained in one instance by means of curve fitting) and the more detailed expression for the transient rate versus power, an estimate of lifetime can be obtained. In another embodiment, a curve or functional relationship for lifetime versus power is obtained from the limited number of measurements and the more detailed expression of the transient rate versus power can be used to refine an estimate of lifetime.

In an exemplary embodiment of the method of FIG. 10, these teachings not being limited to only that embodiment, the power is increased at 10% intervals until the value of about 20% above rated power is reached. The laser diode is then tested until it fails.

The embodiments of the system of these teachings shown in FIGS. 5*a*, 5*b*, 5*c*, 6*a* and 6*b* can be utilized to obtain the transient rate used in the method of FIG. 10. In FIGS. 5*a* and 6*b*, the computer readable memory (475, FIG. 5 *a*; 755, FIG. 6*b*) has computer readable code embodied therein that causes one or more processors to determine the transient rate. In FIGS. 5*b* and 6*a*, the rate determining component 595 determines the transient rate.

Figure 11:
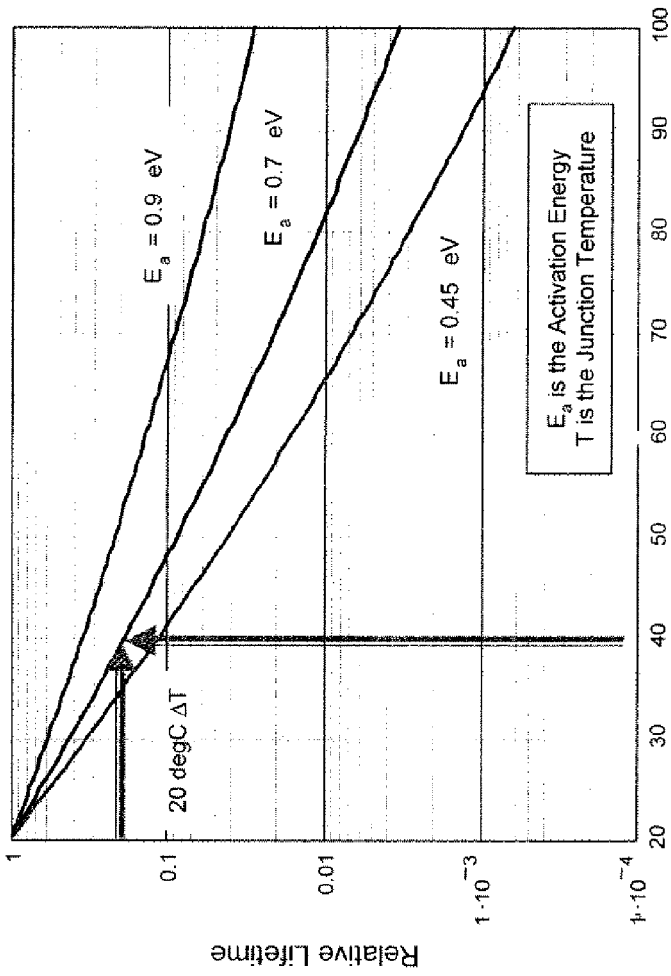
FIG. 11 is a schematic graphical representation of an expression of lifetime as a function of junction temperature.

The embodiments of the system of these teachings shown in FIGS. 6*a* and 6*b* detect a temperature rise of the junction temperature by means of detecting a wavelength shift. The indication of the junction temperature when combined with the estimates of lifetime provides enough information to obtain an estimate of the parameters in the Arrhenius equation, shown in FIG. 11. In an embodiment of the method of these teachings, the method of FIG. 10, includes the additional steps of estimating lifetime as a derated power, and the additional step of obtaining the junction temperature when detecting the anomalous transient behavior provide all the necessary information for obtaining an estimate of the parameters in the Arrhenius equation. In one embodiment, curve fitting or parameter estimation can be used for obtaining the estimate.

It should be noted that although in some of the embodiments presented above the methods and systems are described in terms of the device terminal voltage, in some embodiments the methods and systems can also be implemented in terms of the device junction voltage. The term "device voltage" as used hereinafter refers to, but not limited to, device terminal voltage (also called terminal voltage) or device junction voltage (also called junction voltage).

It should be noted that, although the term laser diode is utilized in the description of the methods and systems of these teachings, the method and system of these teachings can also be applied to laser diode arrays.

Although the above embodiments have been described in reference to laser diode screening, the methods and systems of these teachings can be utilized for screening of semiconductor devices with diode junctions.

It should be noted that the systems of these teachings can be partially (or in some cases completely) integrated onto the laser diode bar.

It should be noted that, although the above teachings, are presented in terms of filamentation, other anomalous conditions can result in the same observed behavior and are within the scope of these teachings. These teachings are not limited to any one model of anomalous behavior.

Although the invention has been described with respect to various embodiments, it should be realized that these teachings is also capable of a wide variety of further and other embodiments all within the spirit and scope of the appended claims.

What is claimed is:

1. A method for screening semiconductor junction devices, the method comprising the steps of:
    detecting, while testing a semiconductor junction device, anomalous behavior of the semiconductor junction;
    determining a rate substantially equal to a number of anomalous behavior events in a predetermined time period;
    comparing the rate to a predetermined rate value; and
    culling, if the rate is at least equal to the predetermined rate value, the semiconductor junction device.

2. The method of claim 1 wherein the step of detecting anomalous behavior comprises the step of:
    detecting behavior of device voltage, the behavior capable of being indicative of anomalous junction behavior.

3. The method of claim 2 wherein the step of detecting behavior of the device voltage comprises the steps of:
    detecting the device voltage;
    comparing the detected device voltage to predetermined device voltage behavior; and,
    determining whether the junction behavior is anomalous.

4. The method of claim 1 wherein the step of detecting anomalous behavior comprises the step of:
    detecting behavior of a relationship between device voltage and device current, the behavior capable of being indicative of anomalous junction behavior.

5. The method of claim 4 wherein the step of detecting behavior of the relationship between device voltage and device current comprises the steps of:
    detecting the device voltage;
    detecting the device current;
    evaluating a preselected relationship between device voltage and device current;
    comparing behavior of the preselected relationship to predetermined behavior of the preselected relationship; and,
    determining whether the junction behavior is anomalous.

6. The method of claim 1 wherein the step of detecting anomalous behavior comprises the step of:
    detecting behavior of emitted wavelength indicative of anomalous behavior.

7. The method of claim 6 wherein the step of detecting behavior of the emitted wavelength comprises the steps of:
    detecting the emitted wavelength;
    comparing the detected emitted wavelength to predetermined emitted wavelength behavior; and,
    determining whether the junction behavior is substantially anomalous.

8. A system for screening semiconductor junction devices, the system comprising:
    a sensing component capable of providing a sensing output indicative of whether behavior of a semiconductor junction device is substantially anomalous;
    a comparator subsystem capable of comparing the sensing output to at least one predetermined value; an output of said comparator subsystem indicating whether behavior of the device is substantially anomalous;
    a counter/rate determining component capable of receiving the output of the comparator subsystem and of providing a rate, said rate being substantially equal to a number of anomalous behavior events in a predetermined time period;
    another comparator subsystem capable of comparing the rate to the at least one predetermined rate value; an output of said another comparator subsystem indicating whether to cull the semiconductor junction device from testing.

9. The system of claim 8 wherein said sensing component comprises:
    a voltage measuring subsystem capable of providing values indicative of device voltage; and
    wherein said sensing output comprises the values indicative of device voltage.

10. The system of claim 8 wherein the comparator subsystem comprises:
    at least one processor;
    at least one computer readable memory having computer readable code embodied therein capable of causing the at least one processor to compare said sensing output to the at least one predetermined value.

11. The system of claim 8 wherein said sensing component comprises:
    a wavelength detecting subsystem capable of detecting at least one wavelength of electromagnetic radiation emanating from the semiconductor junction; and
    wherein said sensing output comprises said at least one wavelength.

12. The system of claim 8 wherein said sensing component comprises:
    a voltage measuring subsystem capable of providing values indicative of device voltage;
    a current measuring subsystem capable of providing values indicative of device current;
    means for providing values indicative of a preselected relationship between the device voltage and the device current; and
    wherein said sensing output comprises said values indicative of a preselected relationship between the device voltage and the device current.

13. A method for predicting lifetime for a semiconductor junction device, the method comprising the steps of:
    a) operating the semiconductor junction device at an operating power lower than a predetermined power;
    b) detecting, while operating the semiconductor junction device, anomalous behavior of the semiconductor junction;
    c) determining a rate substantially equal to a number of anomalous behavior events in a predetermined time period;
    d) recording the rate;
    e) comparing the rate to a predetermined rate value;
    f) identifying, if the rate is at least equal to the predetermined rate value, the semiconductor junction device as a failed device;
    g) increasing the operating power by a predetermined increment;
    h) repeating, if the operating power is less than the predetermined power and if the semiconductor junction device is not identified as failed, the steps a) and f);
    i) obtaining, if the operating power is at least equal to the predetermined power or if the semiconductor junction device is identified as failed, a relationship between rate and operating power.

14. The method of claim 13 further comprising the step of:
recording, if the semiconductor junction device is identified as failed, a number of anomalous behavior events.

15. The method of claim 13 further comprising the step of:
recording, if the semiconductor junction device is identified as failed, a value indicative of lifetime.

16. The method of claim 13 wherein the step of detecting anomalous behavior comprises the step of:
detecting behavior of emitted wavelength indicative of anomalous behavior.

17. The method of claim 16 wherein the step of detecting anomalous behavior further comprises the steps of:
determining a wavelength shift; and
determining an indicator of junction temperature.

18. The method of claim 17 further comprising the step of:
determining parameters for estimation of lifetime degradation.

19. A system for screening semiconductor junction devices, the system comprising:
means for detecting, while testing a semiconductor junction device, anomalous behavior of the semiconductor junction;
means for determining a rate substantially equal to a number of anomalous behavior events in a predetermined time period;
means for comparing the rate to a predetermined rate value; and
means for culling, if the rate is at least equal to the predetermined rate value, the semiconductor junction device.

* * * * *